United States Patent [19]

Takamatsu

[11] Patent Number: 4,462,003
[45] Date of Patent: Jul. 24, 1984

[54] VARIABLE GAIN AMPLIFIER

[75] Inventor: Hajime Takamatsu, Tokyo, Japan

[73] Assignee: Sony/Tektronix, Tokyo, Japan

[21] Appl. No.: 456,674

[22] Filed: Jan. 10, 1983

[51] Int. Cl.³ ............................................. H03G 3/10
[52] U.S. Cl. .................................. 330/254; 330/144; 330/284; 330/295
[58] Field of Search ............... 330/144, 145, 254, 284, 330/295

[56] References Cited

U.S. PATENT DOCUMENTS 4,328,465 5/1982 Takaoka et al. ................ 330/144 X Primary Examiner—James B. Mullins
Assistant Examiner—Steven J. Mottola
Attorney, Agent, or Firm—George T. Noe

[57] ABSTRACT

A variable gain amplifier including common emitter input transistor, a plurality of common base switching transistor to form a cascode amplifier with said input transistor and a resistive network including a plurality of series resistors is disclosed. A plurality of predetermined gains are obtained by programming the resistors. The resistive network may be shared by two or more variable gain amplifiers to provide a selection amplifier.

8 Claims, 5 Drawing Figures

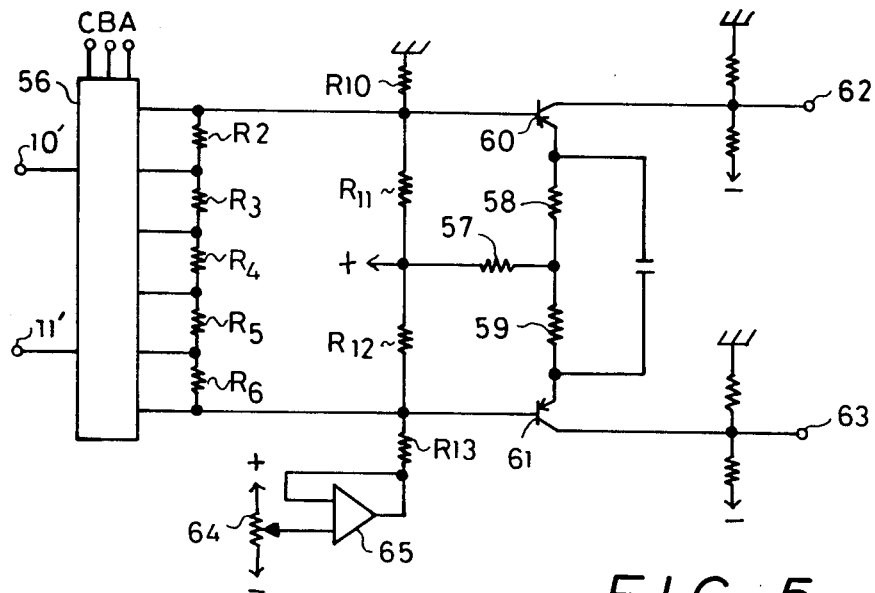
FIG. 5
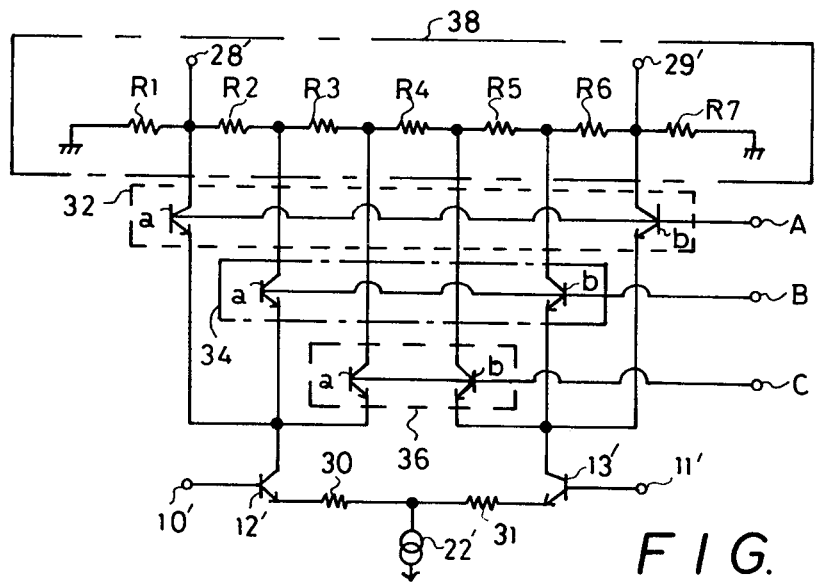
FIG. 2
FIG. 3
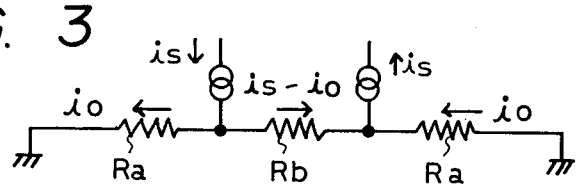

VARIABLE GAIN AMPLIFIER

BACKGROUND OF THE INVENTION

1. Field of the Invention

This invention pertains generally to a variable gain amplifier, more specifically to a wideband amplifier capable of selecting a plurality of predetermined gains.

In electronic test and measurement instruments such as, for example, an oscilloscope, there is a need for wideband amplifiers to provide a plurality of predetermined voltage amplification factors (or gains) with accurate ratios for switching the sensitivity or other purposes. Such wideband amplifiers are required to provide switchable gains of desired ratios while maintaining other electrical characteristics such as frequency response unchanged.

2. Description of Prior Art

One example of conventional amplifier circuits for such purpose is shown in FIG. 1. The base electrodes of a pair of transistors 12 and 13 define input terminals 10 and 11 to which input signals are applied. Coupled between the emitter electrodes are first coupling resistors 16-17 by way of diodes 14 and 15 and also second coupling resistors 20-21 by way of diodes 18 and 19. As described hereinafter, coupling resistors 16-17 and 20-21 are chosen to have different resistance with each other depending on the desired gains. Junctions of the coupling resistors 16-17 and 20-21 are connected to current source 22 each through current switch transistors 24 and 23, respectively. Current switch transistors 23-24 receive at the base electrodes thereof a control signal through control terminal 25 to alternatively turn either one of the transistors depending upon the relatively high voltage level applied to the base control terminals 25. The collector electrodes of differential transistor pair 12-13 are connected to a positive voltage source each through collector load resistors 26 and 27 and also define output terminals 28 and 29. Although not shown in the drawing, a capacitor or a series combination of a resistor and a capacitor is connected in parallel with at least one of coupling resistors 16-17 and 20-21 to compensate for frequency bandwidth of the amplifier.

In operation, the base voltage of one of current switch transistors 23-24, say transistor 24 is raised to relatively high level to turn transistor 24 on, thereby connecting first coupling resistors 16-17 between the emitters of differential transistor pair 12-13 and disconnecting second coupling resistors 20-21 from the circuit by diodes 18-19. Then, this amplifier constitutes a balanced amplifier having a gain determined by the ratio of collector resistor 26 (or 27) and first emitter coupling resistor 16 (or 17). Increasing now the base voltage of the current switch transistor 23 to a relatively high voltage, transistor 23 turns on to connect second emitter coupling resistors 20-21 between the emitters of differential transistor pair 12-13 while disconnecting first emitter coupling resistors 16-17 from the circuit by diodes 14-15. The gain of the amplifier is, then, determined by the ratio of collector load resistor 26 (or 27) and second emitter coupling resistor 20 (or 21). Consequently, the gain of the differential amplifier can be switched by the factor predetermined by the ratio of first and second emitter coupling resistors by turning on and off the current switch transistors 23 and 24.

The prior art curcuit as shown in FIG. 1 includes the following disadvantages. Firstly, the switching of the emitter coupling resistor tends to cause a change in operation signal level of differential transistor pair 12-13. The amplifier gain can hardly be changed while maintaining the frequency bandwidth unchanged. Gain switching to three or more different values will unavoidably increase the emitter circuit wiring, thereby degrading the high frequency signal response. The diodes interposed in series with the base-emitterjunctions accompany gain changes, drift problem, etc. at different temperatures.

SUMMARY OF THE INVENTION

The variable gain amplifier according to this invention comprises a plurality of series resistors and a differential cascode amplifier including a plurality of switchable common base transistors the collectors of which are connected to nodes of the resistors. The amplifier curcuit is implemented symmetrically while deriving an output differential signal from fixed nodes of the resistors.

It is therefore an object of this invention to provide a new variable gain amplifier free from the aforementioned disadvantages of the conventional amplifier.

It is another object of this invention to provide a variable gain amplifier capable of varying the gain over a wide range.

It is still another object of this invention to provide a remotely gain controllable amplifier.

It is an additional object of this invention to provide a balanced amplifier capable of providing different gains including 0.

It is yet another object of this invention to provide a selection amplifier circuit including more than two amplifier channels each amplifying a different input signal with selectable gains and the output terminals of such amplifier channels being coupled to common output terminals.

BRIEF DESCRIPTION OF THE DRAWINGS

FIG. 2 is a circuit schematics of one example of the variable gain amplifier according to this invention;

FIG. 3 is an explanatory drawing of the variable gain amplifier shown in FIG. 2;

FIG. 5 is an associate circuitry of the variable gain amplifier according to this invention.

DETAILED DESCRIPTION OF THIS INVENTION

Figure 4:
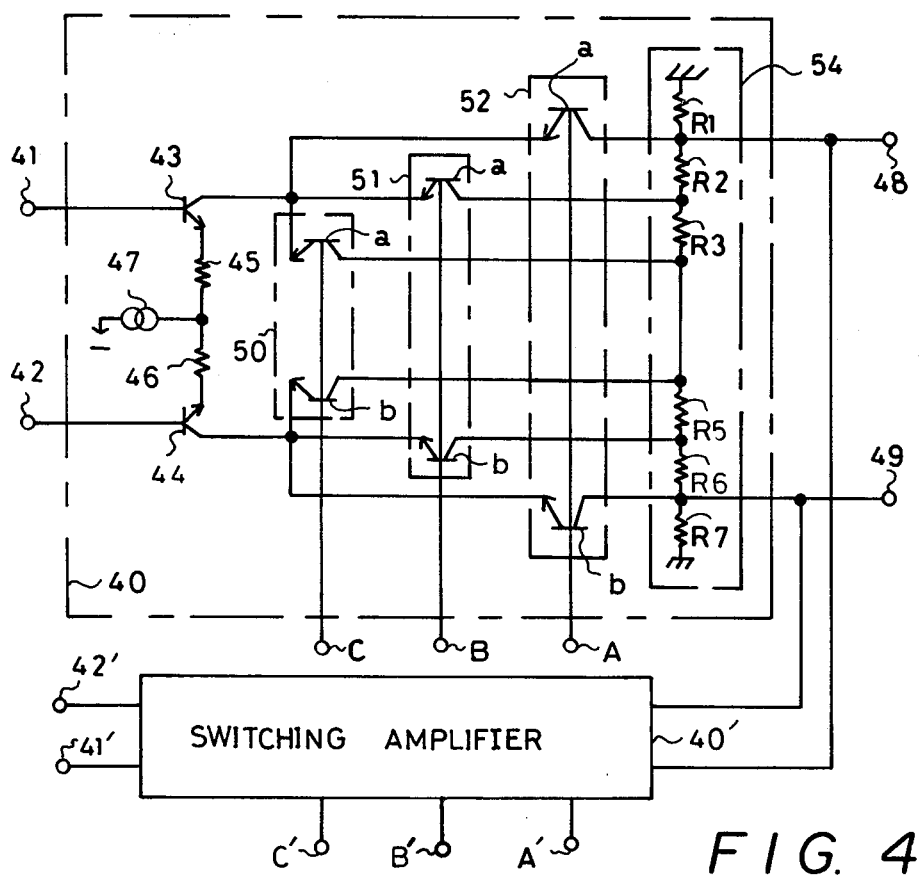
FIG. 4 is an application of the variable gain amplifier according to this invention.
Figure 1:
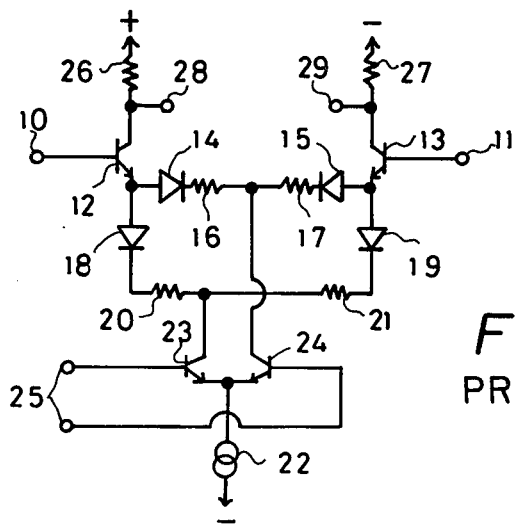
FIG. 1 is a prior art variable gain amplifier.

The variable gain amplifier according to this invention will be described in detail hereinafter by reference to FIGS. 2 through 5. FIG. 2 is a simplified circuit schematics of one preferred embodiment of this invention for switching the gain in three predetermined values. An input signal is applied between input terminals 10'-11', or the base electrodes of differential transistor pair 12'-13' the emitter electrodes of which are coupled together through a pair of emitter coupling resistors 30-31. Connected to the mid point of emitter coupling resistors 30-31 is constant current source 22'. The collector electrodes of transistor pair 12'-13' are connected to each node of resistor network 38 including serially connected resistors $R_1$ through $R_7$ by way of switching transistor pair each including three transistors 32a, 34a and 36a (32b, 34b and 36b). The node of resistors $R_1$ and $R_2$ or the collector electrode of transistor 32a defines output terminal 28'. Similarly, the node of resistors $R_6$ and $R_7$, or the collector of transistor 32b defines output-terminal 29'. The base electrodes of each switching transistor pair 32ab, 34ab, or 36ab are connected to each other to define gain switching control terminals A, B and C.

In operation of the amplifier of FIG. 2, assuming that a relatively high control voltage is applied to control terminal A, for example, from a logic circuit, switching transistor pair 32ab are conducting while transistor pairs 34ab and 36ab non-conducting. The differential collector output currents of differential transistor pair 12'-13' are directly supplied to output terminals 28' and 29' through transistor pair 32ab which constitute a cascode differential amplifier along with differential transistor pair 12'-13'. Although not shown in FIG. 2, it is assumed that a utilization circuit such as an emitter follower, a common emitter transistor, etc. having a sufficiently high input impedance is connected to output terminals 28' and 29'. As is best understood from the description below by reference to FIG. 3, the current splitting factor is the minimum when control terminal A is active, thereby providing the maximum output or the maximum gain. When control terminal B is increased to a relatively high level, switching transistor pair 34ab become conductive to supply the differential collector currents of differential transistor pair 12'-13' respectively to the nodes of resistors $R_2$-$R_3$ and $R_5$-$R_6$. The current splitting ratio is further increased, thereby decreasing the signal current transmitted to output terminals 28'-29' as compared with the first instance and providing a medium gain. Finally, when control terminal C is activated, the collector signal currents are supplied respectively to the nodes of resistors $R_3$-$R_4$ and $R_4$-$R_5$. The signal percentage transmitted to output terminals 28' and 29' becomes the minimum in this instance, thereby minimizing the gain. In summary, the variable gain amplifier according to this invention operates to supply the signal currents to different nodes of resistive network 38 to split such signal currents in different ratios, thereby developing output signal of different gains across both end resistors $R_1$ and $R_7$ of resistive network 38.

Now, the voltage gain of the variable gain amplifier of FIG. 2 will be calculated. Let the input signal voltage between input terminals 10'-11' be ei. The differential collector current is of transistor pair 12'-13' will substantially be given by the following expression:

$$is = ei/Re \qquad (1)$$

where Re is composite resistance of emitter coupling resistors 30 and 31. The operation and gain of the amplifier according to this invention will be described hereunder by reference to FIG. 3 which symbolizes the amplifier circuit of FIG. 2. In FIG. 3, is represents the collector signal currents of transistors 12'-13', Ra represents the composite resistance of resistive network 38 at the left and right side of collector current supply points of transistors 12'-13', and Rb represents the composite resistance of resistive network 38 between the two collector current supply points.

Kirchhoff's Law leads the following equation:

$$2Ra\,io = Rb\,(is - io)$$

Therefore, $$io = \frac{Rb}{2Ra + Rb} is \qquad (2)$$

The equation (2) suggests that the currents in resistors $R_1$ and $R_7$ are equal to is multiplied by the ratio of the resistance between the collectors of selected switching transistor pair (Rb) and the total resistance of resistive network 38

$$\left( \sum_{i=1}^{7} Ri \right).$$

By choosing resistance of resistors $R_1$ through $R_7$
$R_1 = R_7 = 4R$
$R_2 = R_4 = R_6 = 2R$
$R_5 = R$
where R is any desired positive value, output signal currents ioA, ioB and ioC, when control terminals A, B and C are activated, will be $$ioA = \frac{8R}{16R} io = \tfrac{1}{2} io \qquad (3)$$

$$ioB = \frac{4R}{16R} io = \tfrac{1}{4} io \qquad (4)$$

$$ioC = \frac{2R}{16R} io = \tfrac{1}{8} io \qquad (5)$$

Therefore, $$ioA:ioB:ioC = 4:2:1 \qquad (6)$$

The output voltages on output terminals 28' and 29' will be equal to the resistance of resistor $R_1$ or $R_7$ (referred to RL below) multiplied by the respective current ioA, ioB or ioC. The ratio of the output signal voltages will also be 4:2:1 as given by the above expression (6).

Now, the approximate maximum voltage gain of the amplifier when control terminal A is activated will be calculated. The output signal voltage eo on output terminals 28' and 29' will be as follows from the above expressions (1) and (3).

$$eo = RL\,io = \tfrac{1}{2} RL\,is = \frac{RL}{2Re} ei \qquad (7)$$

$$\text{Voltage gain} = \frac{2eo}{ei} = \frac{RL}{Re} \qquad (8)$$

The differential voltage gain of the variable gain amplifier of FIG. 2 will be respectively RL/Re, RL/2Re and RL/4Re when control terminals A, B and C are activated in the example using the aforementioned particular resistive network.

As understood from the foregoing description, the variable gain amplifier according to this invention can provide controllable voltage gains over a wide range by selectively switching a plurality of switching transistors connected to the programmed resistive network at the output of a differential amplifier. In the amplifier of FIG. 2, resistor $R_4$ is connected between collectors of switching transistor pair 36ab for selecting the minimum gain, this resistor may be zero to equally splitting the signal currents to both right and left side resistors, thereby cancelling out the signal on the output terminals 28' and 29' to provide no output signal. This characteristic may intentionally be utilized to selectively provide to common output terminals either one of two different input signals with selectable gains. One example of a two channel selection amplifier is shown in FIG. 4.

Although the detail is omitted in FIG. 4, a pair of identical channel 1 (CH1) switching amplifier 40 and channel 2 (CH2) switching amplifier 40' are employed in the switching amplifier. CH1 and CH2 switching amplifiers 40 and 40' include respectively independent input terminals 41-42 and 41'-42' each receiving different differential input signal. Output terminals of these amplifiers are coupled to a utilization circuit by way of common output terminals 48-49. CH1 and CH2 switching amplifiers 40 and 40' may be substantially identical to the variable gain amplifier in FIG. 2 each including input stage differential amplifier transistors 43-44, three switching transistor pair 50ab, 51ab and 52ab also functioning as a common base output stage, and resistive network 54 including resistors $R_1$ through $R_7$. However, primary differences from the circuit in FIG. 2 are elimination of the center resistor 54 in resistive network 54 and connection of both collector electrodes of switching transistor pair 50ab to the mid point of the resistive network.

The selection amplifier of FIG. 4 operates as follows. Firstly, control terminal 40 of CH1 amplifier 40 is activated to amplify the CH1 input signal applied to input terminals 41-42 with its maximum gain, thereby providing the corresponding output signal to output terminals 48-49. When control terminal B is activated, switching transistor pair 51ab become conductive to provide a relatively decreased gain by splitting the signal current of resistive circuit network 54. The corresponding output signal of decreased amplitude is derived from output terminals 48-49. It is understood from the foregoing description that the voltage gain will be any desired value by proper resistance selection of emitter coupling resistors 45-46 and resistive circuit network 54. On activating control terminal C, switching transistor pair 50ab are turned on to add the differential signal currents from differential transistor pair 43-44. Assuming that resistive network 54 is perfectly symmetrical, such signal currents are divided into two equal parts of $R_3$-$R_2$-$R_1$ and $R_5$-$R_6$-$R_7$. Consequently, no CH1 signal current appears on output terminals 48 and 49. It should be noted that the average DC level at output terminals 48-49 remains unchanged. Now, activating either control terminal A' or B' of CH2 switching amplifier 40' under this condition, the CH2 input signal applied to input terminals 41'-42' appears at output terminals 48-49 with relatively higher or lower gain. Thus, CH1 and CH2 input signals may selectively be provided at common output terminals 48-49 with desired gain by selectively activating control terminals A, B, C, A', B', and C'. Both CH1 and CH2 input signals are shut off by activating both control terminals C and C'. Similarly, both CH1 and CH2 input signals may be summed together with desired gain by simultaneously enabling both control terminals A (or B) and A' (or B'). Additionally, it is understood that addition of a polarity switching circuit to CH1 and/or CH2 amplifier will enable us to obtain an output signal $eo = Ae_1 \pm Be_2$, where $e_1$ and $e_2$ represent CH1 and CH2 input signals and A and B represent CH1 and CH2 gains, respectively. The gains A and B may be switched to more than two predetermined different values by employing more than two control terminals and corresponding switching transistor pairs as well as nodes of resistive network 54.

FIG. 5 is one example of an output circuit of the variable gain amplifier according to this invention. Circuit block 56 may be a variable gain amplifier comprising, for example, differential transistor pair and three switching transistor pairs. A differential signal current is supplied to each nodes of series resistive network $R_2$ through $R_6$ to amplify the input signal applied to input terminals 10'-11' with desired gains under control of control terminals A, B and C. The sum of resistors $R_{10}$ and $R_{11}$ corresponds to $R_1$ in FIG. 2 while that of resistors $R_{12}$ and $R_{13}$ corresponds to $R_7$. Output stage transistors 60-61 are a common emitter amplifier including emitter resistors 58 59, thereby providing sufficiently high base input impedance. Potentiometer 64 and voltage follower 65 are used for DC output level control of the amplifier, or to provide necessary biasing. A differential output signal is derived from output terminals 62 and 63 connected to the collectors of transistors 60 and 61. It may well be understood that an emitter follower stage may be interposed at the front stage of transistors 60-61 in case where relatively large resistance is chosen for resistors $R_1$ and $R_7$.

The present invention has been described hereinbefore based on a preferred embodiment and an application thereof. As is understood from the description, the variable gain amplifier according to this invention features the use of a plurality of resistors connected in series between reference potential source and a plurality of switching transistor pairs to couple the differential signal current to each node of the series resistors. The voltage drops across the both extremes of the series resistors are derived as a differential output signal. The voltage gain of the amplifier can be switched to a plurality of different values with high degree of accuracy determined by the resistive network while maintaining the output DC level unchanged. In addition, the emitter circuit and the coupling resistors of the differential amplifier transistors are not switched for all gain settings, thereby providing a wide-band variable gain amplifier having substantially constant frequency response. Remote gain switching may be made by using a logic circuit. The gain can be perfectly zero, thereby allowing us to apply this invention to a selection amplifier of a plurality of input signals.

Although the foregoing description was made only on preferred embodiments, many changes and modifications may be made by those person skilled in the art without departing from the broadest aspect of this invention. For example, this invention may be applied to a single-ended amplifier. Consequently, the scope of this invention should be limited only by the appended claims.

I claim:

1. A variable gain amplifier, comprising:
    an input stage transistor for amplifying an input signal;
    a resistive network including a plurality of resistors connected in series between potential sources;
    a plurality of switching transistors for supplying the collector current of said input stage transistor to each node of said resistive network; and
    control means for selectively enabling either one of said switching transistors;
    wherein an output signal of predetermined different gains is derived from at least one of the resistors of said resistive network.

2. A variable gain amplifier in accordance with claim 1, wherein said input stage transistor and said switching transistors constitute a cascode amplifier.

3. A variable gain amplifier in accordance with claim 2, wherein said control means is a logic circuit to provide a logic signal to the base electrodes of said switching transistors.

4. A variable gain amplifier in accordance with claim 1, wherein the resistors of said resistive network have programmed resistance to provide predetermined gains.

5. A variable gain amplifier in accordance with claim 1 wherein said input stage transistor is a differential amplifier and said switching transistors include a plurality of transistor pairs.

6. A variable gain amplifier in accordance with claim 5 wherein the base electrodes of each transistor pair of said switching transistor pairs are coupled together to receive a control signal from said control means.

7. A selection amplifier including first and second variable gain differential amplifiers each amplifying a respective input signal and the outputs thereof coupled together to a common output section having a plurality of resistors connected in series between potential sources, each of said variable gain differential amplifiers comprising:
   a differential transistor pair;
   a plurality of switching transistor pairs connected between the collector electrode of each of said differential transistor pair and node of said plurality of resistors in said common output section; and
   control means for selectively enabling either one pair of said plurality of switching transistor pairs;
   wherein the collector electrodes of one pair of said switching transistor pairs are coupled together to the mid point of said resistors.

8. A selection amplifier in accordance with claim 7 further including a polarity switching circuit in at least one of said first and second variable gain differential amplifiers.

* * * * *